(12) United States Patent
Aljabri

(10) Patent No.: US 11,078,577 B2
(45) Date of Patent: Aug. 3, 2021

(54) FIBER OPTICS TO MONITOR PIPELINE CATHODIC PROTECTION SYSTEMS

(71) Applicant: Saudi Arabian Oil Company, Dhahran (SA)

(72) Inventor: Saeed Omar Aljabri, Al-Khobar (SA)

(73) Assignee: Saudi Arabian Oil Company, Dhahran (SA)

( * ) Notice: Subject to any disclaimer, the term of this patent is extended or adjusted under 35 U.S.C. 154(b) by 585 days.

(21) Appl. No.: 14/989,582

(22) Filed: Jan. 6, 2016

(65) Prior Publication Data

US 2017/0191171 A1 Jul. 6, 2017

(51) Int. Cl.
| | |
|---|---|
| *C23F 13/22* | (2006.01) |
| *G01R 15/24* | (2006.01) |
| *G01R 33/032* | (2006.01) |
| *C23F 13/04* | (2006.01) |
| *F16L 58/00* | (2006.01) |
| *F17D 5/00* | (2006.01) |

(52) U.S. Cl.
CPC .............. *C23F 13/22* (2013.01); *C23F 13/04* (2013.01); *F16L 58/00* (2013.01); *F17D 5/00* (2013.01); *G01R 15/246* (2013.01); *G01R 33/032* (2013.01); *C23F 2213/32* (2013.01)

(58) Field of Classification Search
CPC .......... C23F 13/02; C23F 13/04; C23F 13/06; C23F 13/22; C23F 2213/10; C23F 2213/11; C23F 2213/32; F16L 58/00; F17D 58/00; F17D 5/00; F17D 5/02; F17D 5/06
See application file for complete search history.

(56) References Cited

U.S. PATENT DOCUMENTS

| | | | |
|---|---|---|---|
| 3,284,702 A | 11/1966 | Ownby | |
| 3,745,452 A * | 7/1973 | Osburn | G01N 17/02 324/254 |
| 4,409,080 A * | 10/1983 | Slough | C23F 13/04 204/196.06 |
| 4,413,679 A * | 11/1983 | Perkins | C23F 13/02 166/248 |
| 4,441,980 A * | 4/1984 | Warne | C23F 13/04 204/409 |
| 4,868,495 A * | 9/1989 | Einzig | G01R 29/0885 324/97 |

(Continued)

FOREIGN PATENT DOCUMENTS

| | | |
|---|---|---|
| EP | 0882975 | 12/1998 |
| EP | 2602609 | 6/2013 |

OTHER PUBLICATIONS

Arbabi ("Corrosive Soils: Causes, Effects and Mitigation", Testing Engineers, 2009, pp. 1-5).*

(Continued)

*Primary Examiner* — Alexander W Keeling
(74) *Attorney, Agent, or Firm* — Fish & Richardson P.C.

(57) ABSTRACT

A system implementing fiber optics to monitor pipeline cathodic protection systems includes a cathodic protection system coupled to a hydrocarbon pipeline and a fiber optic system connected to the cathodic protection system. The cathodic protection system passes a current through the hydrocarbon pipeline to control corrosion of the hydrocarbon pipeline. The fiber optic system measures the current flowing through the hydrocarbon pipeline over time and provides the measured current.

20 Claims, 5 Drawing Sheets

(56) References Cited

U.S. PATENT DOCUMENTS

| | | | |
|---|---|---|---|
| 5,132,620 A | 7/1992 | Rempt | |
| 5,854,557 A | 12/1998 | Tiefnig | |
| 6,366,075 B1* | 4/2002 | Aitken | G01R 15/246 |
| | | | 324/244.1 |
| 6,617,859 B1 | 9/2003 | Orton | |
| 7,027,957 B2 | 4/2006 | Fourie et al. | |
| 7,235,961 B1* | 6/2007 | Penza | C23F 13/02 |
| | | | 204/196.21 |
| 7,247,443 B2 | 7/2007 | Su | |
| 7,274,443 B2 | 9/2007 | Ponstingl et al. | |
| 2002/0039069 A1 | 4/2002 | Chance et al. | |
| 2003/0074162 A1 | 4/2003 | Fourie et al. | |
| 2003/0133657 A1* | 7/2003 | Kochergin | G01N 21/1717 |
| | | | 385/37 |
| 2003/0174328 A1* | 9/2003 | Russell | G01J 4/00 |
| | | | 356/366 |
| 2005/0006250 A1* | 1/2005 | Russell | G01N 17/043 |
| | | | 205/725 |
| 2006/0070871 A1* | 4/2006 | Bushman | C23F 13/02 |
| | | | 204/196.01 |
| 2008/0204274 A1* | 8/2008 | Peters | C23F 13/04 |
| | | | 340/870.07 |
| 2009/0250213 A1 | 10/2009 | Kalb | |
| 2010/0270169 A1* | 10/2010 | Howard | C23F 13/04 |
| | | | 205/727 |
| 2011/0120884 A1* | 5/2011 | Sjong | C23F 13/06 |
| | | | 205/738 |
| 2011/0238347 A1* | 9/2011 | Gemperli | C23F 13/04 |
| | | | 702/65 |
| 2012/0283969 A1 | 11/2012 | Bohnert et al. | |
| 2013/0292265 A1 | 11/2013 | Rogacheva et al. | |

OTHER PUBLICATIONS

Blazejczyk et al. "Measurements of Current in Bus Bar Using Fiber Optic Sensors", published in 2014, 4 pages.

"New DC Current Measurement Technology with Fiber-Optic Sensor", energize, Jan. 2005, 2 pages.

International Search Report and Written Opinion of the International Searching Authority issued in International Application No. PCT/US2017/012106 dated Apr. 6, 2017; 13 pages.

Gonzalez-Martinez et al., "Novel Method for Detecting Weak Magnetic Fields at Low Frequencies," Review of Scientific Instruments, vol. 76, No. 6, May 2005, 6 pages.

Gulf Cooperation Council Examination Report issued in GCC Application No. GC 2016-32236 dated Jan. 8, 2019, 3 pages.

Gulf Cooperation Council Examination Report issued in GCC Application No. GC 2016-32236 dated Jun. 21, 2019, 3 pages.

* cited by examiner

FIBER OPTICS TO MONITOR PIPELINE CATHODIC PROTECTION SYSTEMS

TECHNICAL FIELD

This disclosure relates to pipelines, for example, pipelines that carry hydrocarbons, monitored using fiber optic technology.

BACKGROUND

Pipelines made of steel are used to transport hydrocarbons, for example, as underground hydrocarbon pipelines. Such pipelines are also used in hydrocarbon operations, for example, wellbore drilling and hydrocarbon recovery from a hydrocarbon reservoir to the surface. Corrosion, both internal and external, is responsible for a large quantity of failures in such pipelines. Corrosion is caused by the degradation of metal by a chemical reaction between the metal and non-metallic matter such as water, oxygen, sulfur, or other non-metallic matter. Corrosion causes the metal to return to the form in which the metal originally existed as an ore with complete loss of metallic properties.

Sometimes, cathodic protection (CP) systems are used to mitigate corrosion in pipelines, for example, in specific locations of underground pipelines, such as road crossings, camel crossings, or other locations. CP systems are also used at certain locations in horizontal direct drilling strings. In a CP system, the metal surface is made the cathode of an electrochemical cell. A sacrificial CP system is an example of a CP system in which the surface of the metal (e.g., the hydrocarbon pipeline) is connected to a mass of less noble metal buried or immersed into common electrolyte. The less noble metal is a sacrificial metal that acts as an anode and corrodes instead of the protected metal. An impressed current CP system is another example of a CP system in which the metal surface is connected to the negative of a direct current (DC) power supply. The positive of the DC power supply is connected to a number of anodes buried in the ground or impressed in soil or water.

SUMMARY

This disclosure describes fiber optics to monitor pipeline CP systems. This disclosure also describes monitoring of current in CP systems in certain underground pipeline locations such as road crossings. This disclosure additionally describes monitoring of current in CP systems in horizontal directional drilling of pipelines. As described below, fiber optic technology is used to monitor the current of the CP systems.

In some aspects, a system includes a cathodic protection system coupled to a hydrocarbon pipeline. The cathodic protection system is configured to pass a current through the hydrocarbon pipeline to control corrosion of the hydrocarbon pipeline. A fiber optic system is connected to the cathodic protection system. The fiber optic system is configured to measure the current flowing through the hydrocarbon pipeline over time, and provide the measured current.

This, and other aspects, can include one or more of the following features. The fiber optic system can include a fiber optic cable connected to the hydrocarbon pipeline. A light generator can be connected to the fiber optic cable. The light generator can be configured to generate light to pass through the fiber optic cable. A polarimeter can be connected to the fiber optic cable. The polarimeter can be configured to detect reflected light that passes through the fiber optic cable. The reflect light can be generated in response to a reflection of the generated light. A signal processor can be connected to the fiber optic cable, the light generator and the polarimeter. The signal processor can be configured to determine a quantity of current flowing through the hydrocarbon pipeline at a time instant based at least on a magnetic field generated by the current flowing through the hydrocarbon pipeline and the reflection of the light passing through the fiber optic cable. The signal processor can be configured to detect multiple quantities of current at a corresponding multiple time instants. The signal processor can be configured to determine a current density of the current flowed through the hydrocarbon pipeline by the cathodic protection system and compare the determined current density with a threshold current density. Based on a result of the comparing, the signal processor can be configured to determine that the current density satisfies the threshold density. Based on a result of the comparing, the signal processor can be configured to determine that the current density does not satisfy the threshold current density and cause the cathodic protection system to modify a specified current passed to the hydrocarbon pipeline to modify the current density to satisfy the threshold current density. The fiber optic cable can be coiled around a length of the hydrocarbon pipeline. The hydrocarbon pipeline can be an underground hydrocarbon pipeline and can include a first portion and a third portion positioned in aerated soil, and a second portion positioned in non-aerated soil and between the first portion and the third portion. The fiber optic cable can be coiled around each of the first portion, the second portion and the third portion. The hydrocarbon pipeline can be a horizontal drill string in a horizontal wellbore drilling system. The cathodic protection system can be configured to pass a specified current to the hydrocarbon pipeline and the fiber optic system can be configured to detect the current flowing through the hydrocarbon pipeline over time while hydrocarbons are flowing through the hydrocarbon pipeline.

In some aspects, a method includes passing a specified quantity of current to an underground hydrocarbon pipeline to control external corrosion of the underground hydrocarbon pipeline. A quantity of current flowing through the underground hydrocarbon pipeline is affected by the external corrosion of the underground hydrocarbon pipeline. The method includes monitoring reflected light passing through a fiber optic cable connected to the underground hydrocarbon pipeline. The reflected light is modulated by a magnetic field produced by the quantity of current flowing through the underground hydrocarbon pipeline. The method includes determining, based on the monitored reflected light, the quantity of current flowing through the underground hydrocarbon pipeline.

This, and other aspects, can include one or more of the following features. Determining the quantity of the current flowing through the underground hydrocarbon pipeline can include determining multiple quantities of current flowing through the underground hydrocarbon pipeline at corresponding multiple time instants. A current density of the current flowed through the underground hydrocarbon pipeline by the cathodic protection system can be determined and compared with a threshold current density. Based on a result of the comparing, it can be determined that the current density satisfies the threshold density. Or, based on a result of the comparing, it can be determined that the current density does not satisfy the threshold current density. The specified current passed to the underground hydrocarbon pipeline can be modified to satisfy the threshold current density. To connect the fiber optic cable to the underground hydrocarbon pipeline, the fiber optic cable can be coiled around a length of the underground hydrocarbon pipeline. The underground hydrocarbon pipeline can include a first portion and a third portion positioned in aerated soil, and a second portion positioned in non-aerated soil and between the first portion and the third portion. The fiber optic cable can be coiled around each of the first portion, the second portion and the third portion. The hydrocarbon pipeline can be a horizontal drill string in a horizontal wellbore drilling system.

In some aspects, a method includes coiling a fiber optic cable around an underground hydrocarbon pipeline connected to a cathodic protection system configured to pass a specified quantity of current to the underground hydrocarbon pipeline to control external corrosion of the underground hydrocarbon pipeline. A quantity of current flowing through the underground hydrocarbon pipeline is affected by the external corrosion of the underground hydrocarbon pipeline. Light is passed through the fiber optic cable. Reflected light passing through a fiber optic cable in response to the light is monitored. The reflected light is modulated by the quantity of current flowing through the underground hydrocarbon pipeline. Based on the monitored reflected light, the quantity of current flowing through the underground hydrocarbon pipeline is monitored.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Cathodic protection (CP) systems are used to mitigate corrosion, for example, external corrosion, in underground pipelines, for example, in specific locations of the pipelines, such as road crossings, camel crossings or other specific locations. CP systems are also used at certain locations in horizontal direct drilling strings. In such CP systems, a current (for example, direct current) is applied to the specific location of the pipeline. This disclosure describes a fiber optics-based real-time measurement system of the CP current. To measure the current, a length of fiber optic cable is coiled around a section of the pipeline. The CP system passes current to the section of the pipeline. The current that actually flows through the pipeline can be different from the current that the CP system passes to the pipeline, in part, due to pipeline corrosion. The light transmitted through the fiber optic cable is modulated by the current. The modulation is measured and converted into the current that flows through the section of the pipeline. In this manner, the current applied to the section of the pipeline can be measured in real-time.

Figure 1:
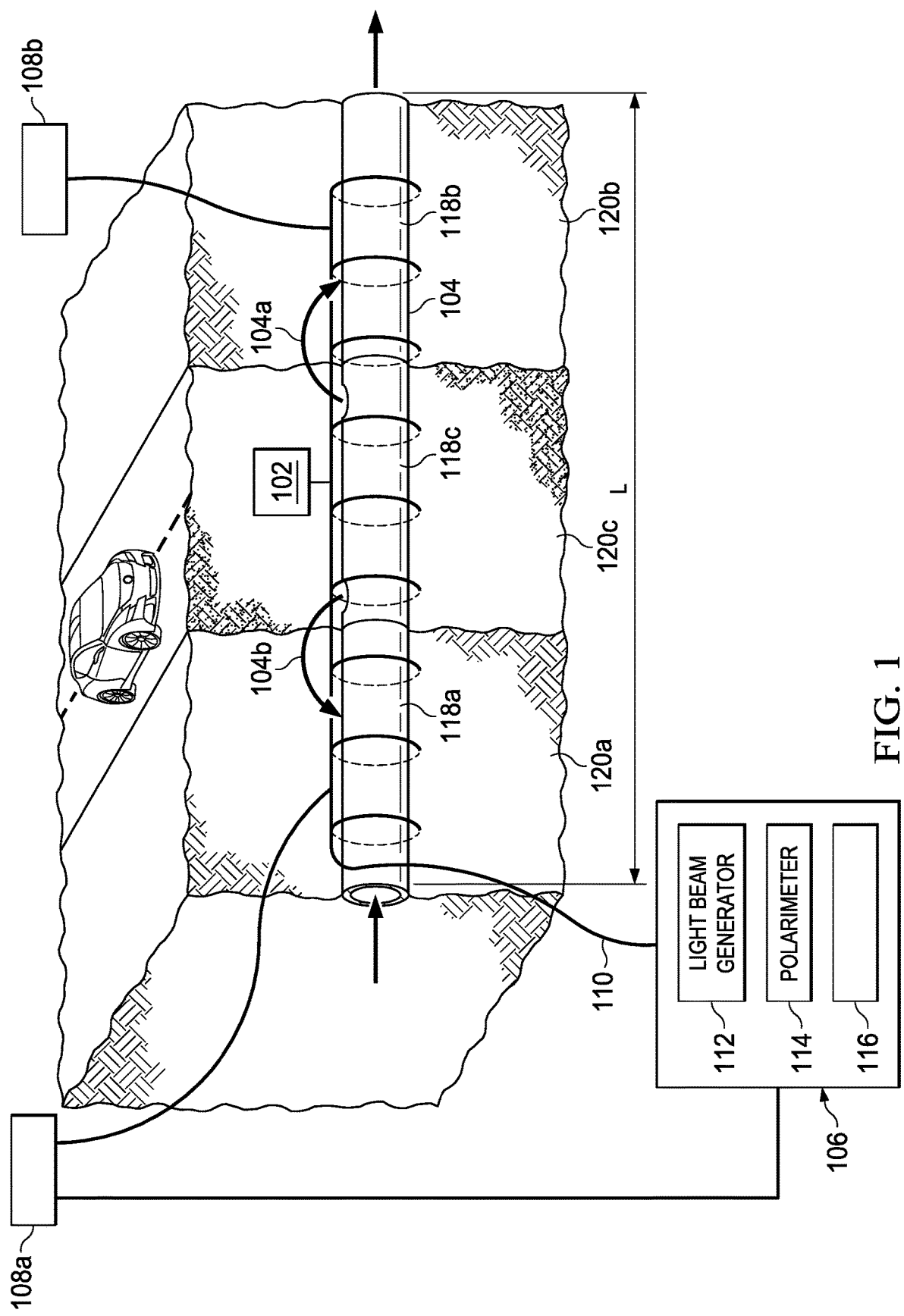
FIG. 1 is an example of a schematic diagram of a fiber optic cathodic protection monitoring system.

FIG. 1 is an example of a schematic diagram of a fiber optic cathodic protection monitoring system. The system includes a CP system 102 coupled to a hydrocarbon pipeline 104. The hydrocarbon pipeline 104 can be any sub-surface pipeline that is susceptible to corrosion. For example, the hydrocarbon pipeline 104 can be made from steel or other material that can corrode when buried beneath the surface. In some implementations, the hydrocarbon pipeline 104 can be used to transport hydrocarbons (for example, petroleum, natural gas, combinations of them or other hydrocarbons) between two locations. Alternatively or in addition, any pipeline through which fluids can be flowed (for example, drilling fluids, hydraulic fracturing fluids, or other fluids) can be implemented.

The CP system 102 can be configured to pass a current through the hydrocarbon pipeline 104 to control corrosion of the pipeline 104. External corrosion of the pipeline 104 is caused by reactions between the pipeline 104 and the surrounding environment. The corrosion occurs when electrons move from the pipeline and combine with hydrogen atoms in the electrolyte. The electrolyte, for example, can include the sand surrounding the pipelines which can have a concentration of hydrogen atoms. A quantity of corrosion can depend on the environment in which the hydrocarbon pipeline 104 is buried. For example, the hydrocarbon pipeline 104 can be buried in a desert environment with road crossings or camel crossings (or both). In some portions of such an environment, the possibility of pipeline corrosion is high due to increased oxygen concentration.

The CP system 102 can be implemented to mitigate corrosion in the hydrocarbon pipeline 104 by applying an electrical current that will pass through the soil to the pipelines (represented in FIG. 1 by electric current lines 104a and 104b that show a direction of the current). As described below, the CP system 102 can pass a specified quantity of current to the hydrocarbon pipeline 104 to mitigate a corrosion in the pipeline 104. As the resistance of the current path changes, a quantity of current that actually flows through the hydrocarbon pipeline 104 also changes. The resistance of the current path is affected by factors including, for example, a thickness of coatings on the hydrocarbon pipeline 104, soil resistivity, or other factors that contribute to external corrosion of the pipeline 104. Knowing a quantity of current flowing through the hydrocarbon pipeline 104 not only provides information about a quantity of corrosion in the pipeline 104 but also provides information about the coatings (for example, a thickness of the coatings) and soil resistivity. Knowing the quantity of current also provides information about the condition of the CP system 102, for example, if the system is passing a required quantity of current to the pipeline 104. The information gathered by monitoring the quantity of current flowing through the pipeline 104 can be used to optimize the CP system 104 based on the pipeline coatings, pipeline contents, soil resistivity or combinations of them.

The system includes a fiber optic system 106 connected to the CP system 102. As described below, the fiber optic system 106 is configured to measure the current flowing through the hydrocarbon pipeline 104 over time and to provide the detected current. For example, the quantity of current flowing through the pipeline 104 can generate a magnetic field around the pipeline 104. A strength of the magnetic field can vary with current, which, in turn, can vary based on factors such as those described above. A light signal carried by a fiber optic cable can be modulated by the magnetic field. As described below, the fiber optic system 106 can determine the quantity of current flowing through the hydrocarbon pipeline 104 based on the modulation of the light signal. In some implementations, the system 106 can include transmitters (not shown) that can transmit the detected current to a remote central system over networks (for example, wide area networks, satellite networks, other networks or combinations of them). As described in detail below, operators of the remote central system can determine if a quantity of current flowing through the hydrocarbon pipeline 104 is sufficient to mitigate external corrosion in light of the soil conditions and pipeline conditions (for example, coating thickness).

In some implementations, the system can include multiple test stations (for example, a first test station 108a, a second test station 108b, and more or fewer test stations). The test stations can be located above the surface, for example, in immediate proximity to the CP system 102 or the fiber optic system 106. Alternatively or in addition, the test stations can be located above the surface, for example, at remote locations. Each test station can be operated to measure the pipe to soil potential.

The fiber optic system 106 can include a fiber optic cable 110 connected to the hydrocarbon pipeline 104. In some implementations, the fiber optic cable 110 can be coiled around a length L of the hydrocarbon pipeline 104. In some implementations, the length of the underground pipeline 104 can include a first portion 118a, a second portion 118b and a third portion 118c. The first portion 118a and the second portion 118b can be positioned in one type of soil, for example, aerated soil 120a and 120b, respectively. The third portion 118c can be positioned in a different type of soil, for example, non-aerated soil 120c. For example, the third portion 118c can be a road crossing or a camel crossing sandwiched between two desert environments. The fiber optic cable 110 can be coiled around each of the first portion 118a, the second portion 118b and the third portion 118c. In some implementations, a number of coils of the fiber optic cable in each section can be varied to obtain different current density values in different portions of the pipeline. The current density value is representative of the resistivity of the soil in which a portion of the pipeline is buried.

The fiber optic system 106 can also include a light generator 112 connected to the fiber optic cable. In some implementations, the light generator 112 is a laser source. For example, the light generator 112 can be an optoelectronics module light source of a fiber-pigtailed laser with a wavelength of substantially 1500 nm. The light generator 112 can be coupled to an end of the fiber optic cable 110. The fiber optic cable 110 can carry light generated by the light generator 112 through the fiber optic cable 110 connected to (for example, coiled around) the length of the hydrocarbon pipeline 104. The fiber optic cable 110 can also carry reflected light generated in response to the light carried through the cable 110. A fiber Bragg grating (FBG) can be used to reflect the light. For example, the FBG can be a type of distributed Bragg reflector which reflects specific wavelengths of light while transmitting other wavelengths.

The fiber optic system 106 can include a polarimeter 114 connected to the fiber optic cable 110. The polarimeter can detect the reflected light that passes through the fiber optic cable 110. The fiber optic system 106 additionally includes a signal processor 116 connected to the fiber optic cable 110, the light generator 112 and the polarimeter 114. The signal processor 116 can be implemented as a computer-readable medium storing instructions executable by one or more computer processors to perform operations described here. Alternatively or in addition, the signal processor 116 can be implemented as processing circuitry configured to perform operations described here.

As described above, the quantity of current flowing through the hydrocarbon pipeline 104 generates a magnetic field around the pipeline 104. The signal processor 116 can determine a quantity of current flowing through the hydrocarbon pipeline 104 at a time instant based on a strength of the magnetic field and properties of the reflected light carried through the fiber optic cable 110. In some implementations, the light generator 112, the polarimeter 114 and the signal processor 116 can be housed in a single housing. Alternatively, each component or any combination of the three components can be positioned in a respective housing. In some implementations, the fiber optic system 106 can be positioned above the surface, for example, at or near a test station.

Figure 2:
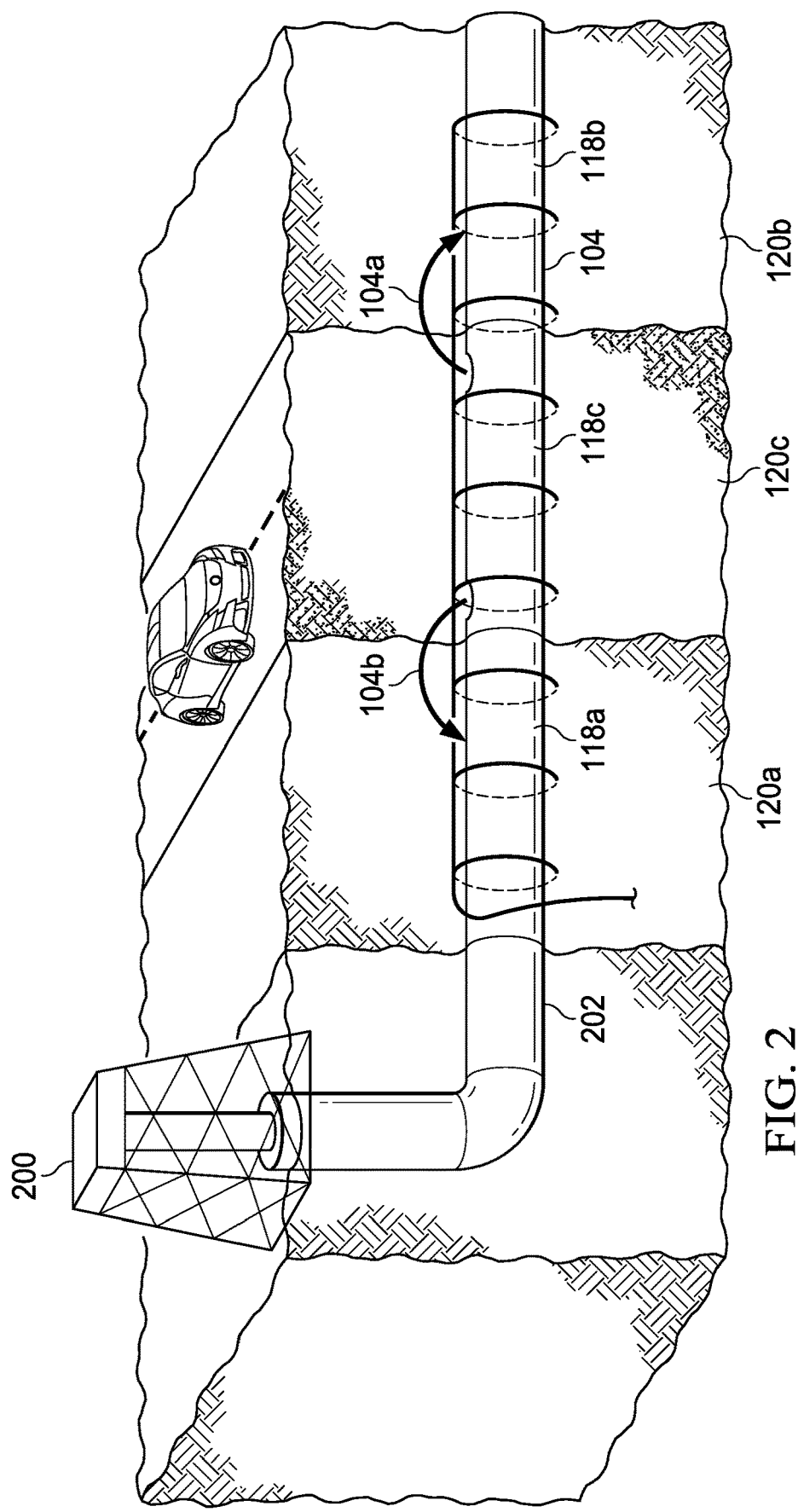
FIG. 2 is an example of a schematic diagram of a fiber optic cathodic protection monitoring system.

FIG. 2 is an example of a schematic diagram of a fiber optic cathodic protection monitoring system. The fiber optic cathodic protection monitoring system described with reference to FIG. 1 was implemented in a hydrocarbon pipeline 104 that transported hydrocarbons between locations. The system described with reference to FIG. 2 can be implemented in a hydrocarbon pipeline that is part of wellbore tubing 202. For example, the wellbore tubing 202 can be a drill string in horizontal wellbore drilling system 200. Alternatively, the wellbore tubing 202 can be a production string installed in a horizontal wellbore. In general, the hydrocarbon pipeline described here can be part of tubing used in any hydrocarbon-related operations in which tubing are installed vertically, horizontally or at angles such that portions of the tubing pass through different types of underground environments. In addition, the fiber optic system described here can be implemented to monitor, over time, current provided by the CP system to the hydrocarbon pipeline 104 either when no fluids are flowing through the pipeline 104 or when fluids (for example, drilling fluids, production fluids, other fluids) are flowing through the pipeline.

Figure 3A:
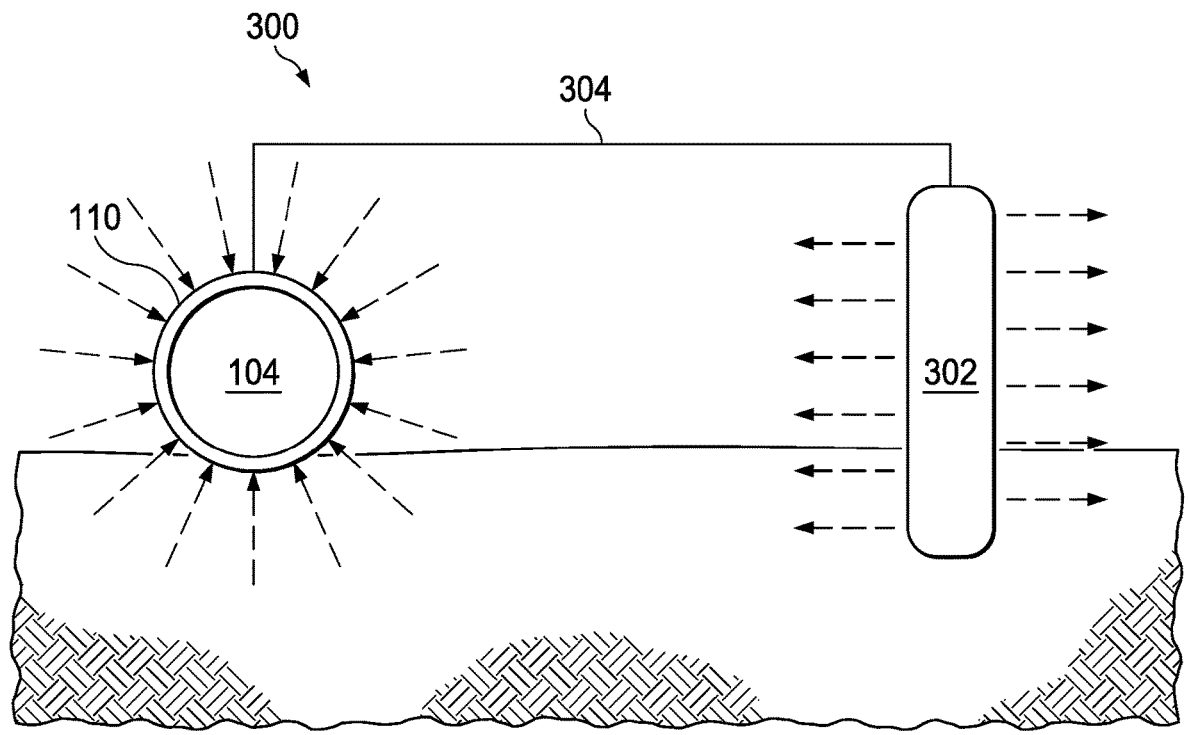
FIGS. 3A and 3B are examples of schematics of cathodic protection systems.
Figure 3B:
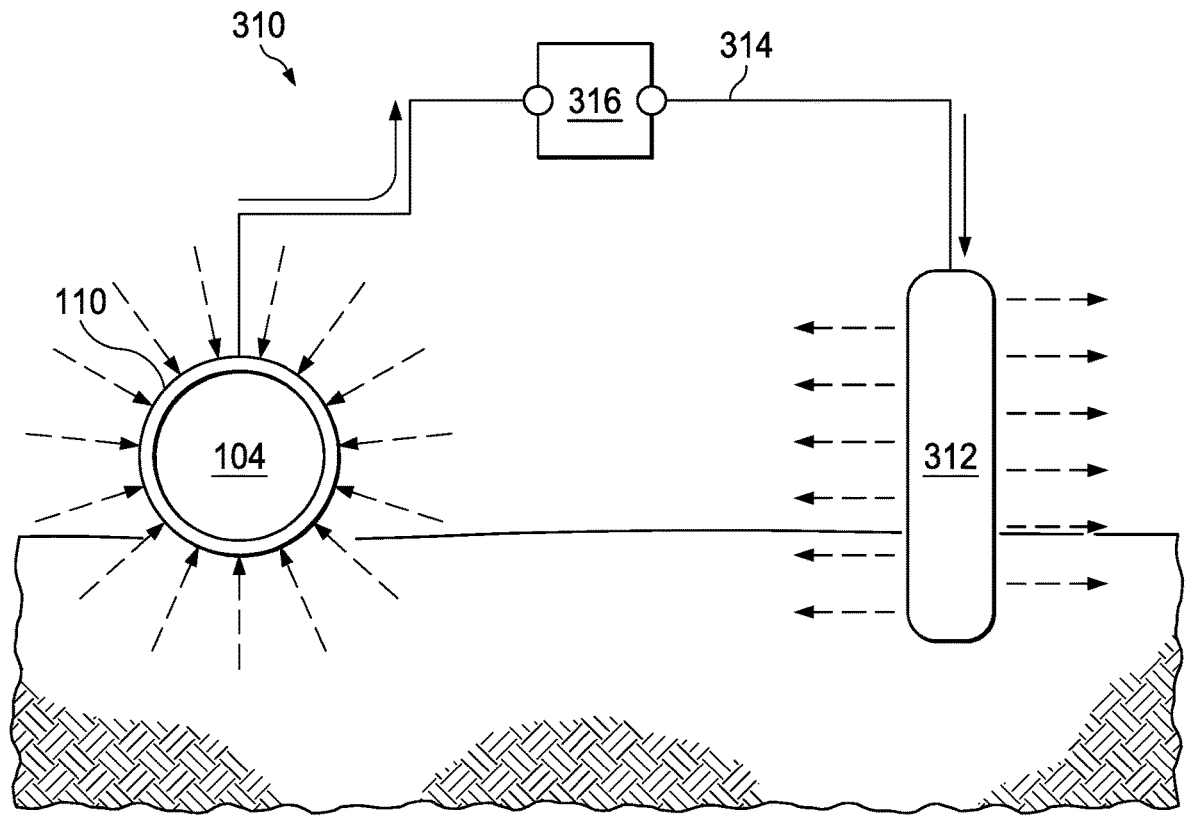

FIGS. 3A and 3B are examples of schematics of CP systems. FIG. 3A is an example of a schematic of a sacrificial CP system. In such systems, the surface of the structure to be protected from corrosion (for example, the hydrocarbon pipeline 104) is electrically connected to a sacrificial anode 302 using a conducting material, for example, a metallic conductor 304. The sacrificial anode 302 can be a mass of less noble metal buried or immersed with the hydrocarbon pipeline 104 in a common electrolyte.

FIG. 3B is an example of a schematic of an impressed current CP system. In such systems, the surface of the structure to be protected from corrosion (for example, the hydrocarbon pipeline 104) and a ground bed anode 312 are connected to a negative terminal and a positive terminal, respectively, of a direct current (DC) source 316 through metallic conductors 314. The ground bed anode 312 can include multiple anodes buried in the ground or impressed in the same soil or water as the pipeline 104. In such systems, current can flow from each anode in the ground bed anode 312 to the pipeline 104. Portions of the pipeline 104 that are uncoated or from which the coatings have worn off (for example, due to corrosion) can permit the current to pass through while the coated portions being dielectric media can prevent the flow of current. In some implementations, the impressed current CP system can include a rectifier with a positive terminal connected to multiple grounded anodes in series and the negative terminal connected to the hydrocarbon pipeline 104.

Figure 4:
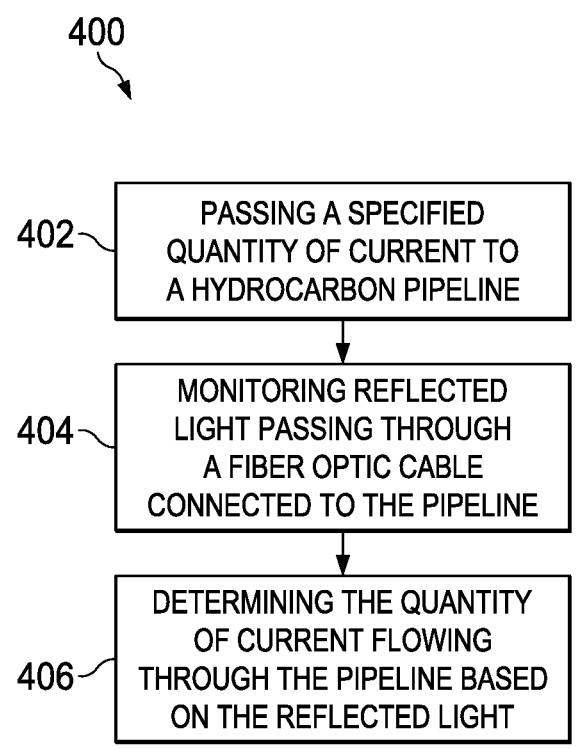
FIG. 4 is a flowchart of an example process of determining current flowing through a hydrocarbon pipeline.

FIG. 4 is a flowchart of an example process 400 of determining current flowing through a hydrocarbon pipeline. At 402, a specified quantity of current is passed to a hydrocarbon pipeline. For example, a CP system can pass the specified quantity of current to the hydrocarbon pipeline 104. In implementations in which the CP system is a sacrificial system, current is passed to the hydrocarbon pipeline from the sacrificed anodes. At 404, reflected light passing through a fiber optic cable connected to the pipeline is monitored. For example, the fiber optic cable 110 is coiled around a length of the hydrocarbon pipeline 104. Light from a light generator 116 and reflected light in response to the generated light are passed through the fiber optic cable 110. A polarimeter 114 detects the reflected light, particularly, properties of the reflected light, for example, a reflection angle, a quantity of the reflected light or other properties.

At 406, the quantity of current flowing through the pipeline is determined based on the reflected light. For example, the signal processor 116 determines the quantity of current flowing through the pipeline based, in part, on a strength of a magnetic field created by the current flowing through the pipeline 104. The principle of fiber optic current measurement originated from the Faraday Effect, which relates the magnetic field being produced by an electric current and a reflection of a light signal traveling in a fiber optic cable. In some implementations, the polarimeter 114 can measure the light reflection angle. Based on the light reflection angle, the signal processor 116 can measure a polarization rotation angle according to Equation (1).

$$\theta = \mu v H1 = VBl \qquad (1)$$

In Equation (1), θ is a polarization rotation angle, μ is permeability of Faraday rotator material, V is Verdet constant, B is magnetic flux density and l is the length of interaction between magnetic flux density and light beam, for example, the length L of the pipeline 104. The magnetic flux density is related to the measured electrical current by Equation (2).

$$\int CB \cdot di \qquad (2)$$

In Equation (2), i is the electrical current. The signal processor 116 can transmit the measured electrical current, for example, to a test station or other location at which the current is monitored.

Figure 5:
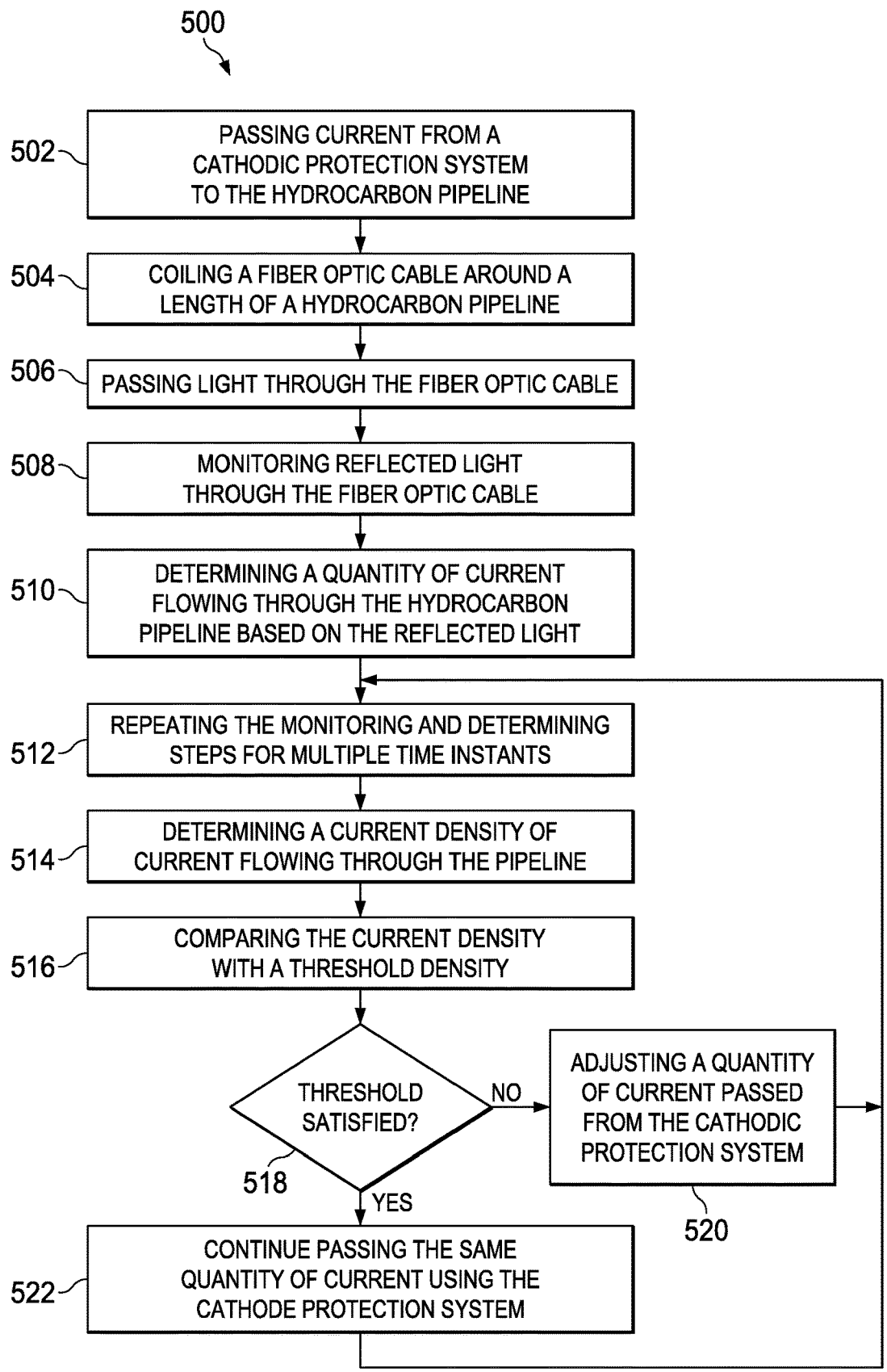
FIG. 5 is a flowchart of an example process of monitoring current from a CP system flowing through a hydrocarbon pipeline.

FIG. 5 is a flowchart of an example process 500 of monitoring current from a CP system flowing through a hydrocarbon pipeline. The process 500 can be implemented to determine if a quantity of current being passed to the hydrocarbon pipeline 104 is sufficient to mitigate pipeline corrosion. At 502, current from a CP system is passed to the hydrocarbon pipeline, for example, the hydrocarbon pipeline 104, to mitigate corrosion in the pipeline. The fiber optic system can be connected to the hydrocarbon pipeline 104. At 504, a fiber optic cable is coiled around a length of the pipeline 104. The fiber optic system is then operated to pass light through the fiber optic cable and to receive reflected light. At 506, light is passed through the fiber optic cable. At 508, reflected light through the fiber optic cable is monitored. At 510, a quantity of current flowing through the hydrocarbon pipeline is determined based at least on the reflected light.

Implementing the steps above allows determining the quantity of current flowing through the pipeline at a time instant. At 512, the monitoring and determining steps are repeated for multiple successive time instants. At each time instant, a respective quantity of current flowing through the pipeline is determined. At 514, a current density of current flowing through the pipeline 104 is determined based on the currents determined at the multiple time instants.

At 516, the current density is compared with a threshold current density. The threshold density can depend on factors including the soil in which the hydrocarbon pipeline is buried and the coatings on the pipeline. For example, in the absence of coatings, the threshold current density can be about 20 mA/m². Depending on the type of coatings (for example, tape wrap, coal tar epoxy, fusion bonded epoxy coating, polyethylene coating), the threshold current density can range between about 0.1 mA/m² and about 1.25 mA/m². The threshold current density can also depend on the soil resistivity measured in ohm·m. For example, for soil resistivity increasing from less than 10 ohm·m to greater to 1000 ohm·m, the threshold current density can decrease from about 20 mA/m² to about 1 mA/m². The threshold current density can also be determined based on a surface area to be protected as shown in Equation (3).

$$I = \frac{A \times C}{1000} \qquad (3)$$

In Equation (3), I is the total current in Amperes, A is the surface area to be protected and C is the current density in mA/m².

If the threshold is satisfied (decision "YES" at check 518), then, at 522, the CP system is continued to operate to pass the same quantity of current to the hydrocarbon pipeline 104. If the threshold is not satisfied (decision "NO" at check 518), for example, the determined current density is less than the threshold density, then, at 520, the CP system is adjusted to pass a different quantity of current to the hydrocarbon pipeline 104. After either step 520 or step 522, the steps to determine the current density by monitoring and determining currents at different time instants are continued to determine that the current density continues to satisfy the threshold current density.

In some implementations, the fiber optic system described here can determine and provide current flowing through the hydrocarbon pipeline in real-time. In other words, instead of gathering current measurements over a duration and providing the measurements at the end of the duration, the fiber optic system can provide current or current density measurements (or both) at multiple time instants within the duration. In addition, a time interval between a determination of current or current density (or both) and output of the same by the signal processor, for example, to a test station or other receiving unit, can be very small (for example, of the order of micro- or nano-seconds). For example, the time interval can be as fast as the processing resources of the signal processor will allow the signal processor to operate.

Real-time knowledge of current flowing through the hydrocarbon pipeline or the current density (or both) can allow monitoring the condition of the CP system. Based on the knowledge, the current passed by the CP system to the hydrocarbon pipeline 104 can be maintained at or above industrially recommended current density values based on the soil types, pipeline coatings, or other conditions. Alternatively or in addition, maintenance and repair operations can be performed on the CP systems using the knowledge of current or current density. For example, in sacrificial CP systems, a decrease in current or current density over a period of time can indicate that the sacrificial anode needs to be replaced. Real-time knowledge of the decrease in current or current density measured using the fiber optic systems described here can enable a faster response to such maintenance and repair.

Thus, particular implementations of the subject matter have been described. Other implementations are within the scope of the following claims.

The invention claimed is:

1. A system comprising:
a cathodic protection system coupled to an underground hydrocarbon pipeline, the underground hydrocarbon pipeline comprises a first portion and a second portion buried in aerated soil, and a third portion positioned between the first portion and the second portion, the third portion buried in non-aerated soil, the cathodic protection system configured to pass a current through the hydrocarbon pipeline to control corrosion of the hydrocarbon pipeline;
a fiber optic system connected to the cathodic protection system, the fiber optic system comprising a fiber optic cable coiled around the underground hydrocarbon pipeline, wherein a first number of coils of the fiber optic cable around the first portion and the second portion is different from a second number of coils of the fiber optic cable around the third portion, wherein the first number of coils is based on a resistivity of soil in which the first portion and the second portion are buried, and the second number of coils is based on a resistivity of soil in which the third portion is buried, the fiber optic system configured to measure in real time the current flowing through the hydrocarbon pipeline over time and provide the measured current, and wherein the fiber optic system comprises a signal processor to determine a current density of the current and compare the current density to a current density threshold.

2. The system of claim 1, wherein the fiber optic system comprises:
a light generator connected to the fiber optic cable, the light generator configured to generate light to pass through the fiber optic cable;
a polarimeter connected to the fiber optic cable, the polarimeter configured to detect reflected light that passes through the fiber optic cable, the reflected light generated in response to a reflection of the generated light; and
the signal processor connected to the fiber optic cable, the light generator and the polarimeter, the signal processor configured to determine a quantity of current flowing through the hydrocarbon pipeline at a time instant based at least on a magnetic field generated by the current flowing through the hydrocarbon pipeline and the reflection of the light passing through the fiber optic cable, wherein the fiber optic system is configured to provide the measured current to a test station in real time.

3. The system of claim 2, wherein the polarimeter is configured to detect properties of the reflected light comprising a reflection angle and a quantity of the reflected light, and wherein the signal processor is configured to detect a plurality of quantities of current at a corresponding plurality of time instants.

4. The system of claim 3, wherein the signal processor is configured to determine the current density based on the plurality of quantities of the current flowed through the hydrocarbon pipeline by the cathodic protection system, wherein the first number of coils is correlative with the current density on the first portion and second portion, and wherein the second number of coils is correlative with the current density on the third portion.

5. The system of claim 4, wherein the current density and the threshold current density comprise units of current per area, wherein the hydrocarbon pipeline comprises wellbore tubing, and wherein the signal processor is configured to determine the quantity of current based on the reflection angle and the quantity of the reflected light.

6. The system of claim 4, wherein, based on a result of the comparing, the signal processor is configured to:
determine that the current density does not satisfy the threshold current density; and
cause the cathodic protection system to modify a specified current passed to the hydrocarbon pipeline to modify the current density to satisfy the threshold current density, wherein the threshold current density is correlative with soil resistivity.

7. The system of claim 2, wherein the fiber optic cable is coiled around a length of the hydrocarbon pipeline, wherein the first number of coils per unit length of the first portion and the second portion is different from the second number of coils of the fiber optic cable per unit length of the third portion, wherein the threshold current density is correlative with a surface area of the hydrocarbon pipeline to be protected.

8. The system of claim 1, wherein the threshold current density is correlative with a coating on the hydrocarbon pipeline wherein the fiber optic cable is coiled around each of the first portion, the second portion and the third portion.

9. The system of claim 7, wherein the hydrocarbon pipeline is a horizontal drill string in a horizontal wellbore drilling system, and wherein the threshold current density is in a range of 0.1 milliamps per square meter (mA/m2) to 1.25 mA/m2.

10. The system of claim 2, wherein the cathodic protection system is configured to pass a specified current to the hydrocarbon pipeline and the fiber optic system is configured to detect the current flowing through the hydrocarbon pipeline over time while hydrocarbons are flowing through the hydrocarbon pipeline, wherein the light generator, the polarimeter, and the signal processor are housed together in a single housing, wherein a time interval between a determination of a quantity of the current and output of the quantity value by the signal processor to a test station is less than 1 microsecond, and wherein the resistivity of soil in which the third portion is buried is different than the resistivity of soil in which the first portion and second portion are buried.

11. A method comprising:
passing a specified quantity of current to an underground hydrocarbon pipeline to control external corrosion of the underground hydrocarbon pipeline, wherein a quantity of current flowing through the underground hydrocarbon pipeline is affected by the external corrosion of the underground hydrocarbon pipeline, wherein the underground hydrocarbon pipeline comprises a first portion, a second portion and a third portion positioned between the first portion and the second portion;
monitoring reflected light passing through a fiber optic cable coiled around the underground hydrocarbon pipeline, wherein the reflected light is modulated by a magnetic field produced by the quantity of current flowing through the underground hydrocarbon pipeline, wherein the fiber optic cable is coiled around the underground hydrocarbon pipeline, wherein a first number of coils of the fiber optic cable around the first portion and the second portion is based on a resistivity of soil in which the first portion and the second portion are buried, and a second number of coils of the fiber optic cable around the third portion is based on a resistivity of soil in which the third portion is buried;

determining, based on the monitored reflected light, the quantity of current flowing through the underground hydrocarbon pipeline;

determining a current density of the current flowed through the underground hydrocarbon pipeline by the cathodic protection system; and comparing the determined current density with a threshold current density.

12. The method of claim 11, wherein monitoring the reflected light passing through the fiber optic cable coiled around the underground hydrocarbon pipeline comprises:

passing light generated by a light generator through the fiber optic cable;

detecting the reflected light that passes through the fiber optic cable, the reflected light generated in response to a reflection of the generated light; and determining in real time the quantity of the current flowing through the underground hydrocarbon pipeline based at least on a magnetic field generated by the current flowing through the underground hydrocarbon pipeline and the reflection of the light passing through the fiber optic cable.

13. The method of claim 12, wherein determining the quantity of the current flowing through the underground hydrocarbon pipeline comprises determining a plurality of quantities of current flowing through the underground hydrocarbon pipeline at a corresponding plurality of time instants.

14. The method of claim 13, determining the threshold current density, wherein the current density comprises units of current per area, wherein the hydrocarbon pipeline comprises wellbore tubing, and wherein the threshold current density is correlative with a coating on.

15. The method of claim 14, comprising varying the first number of coils for the current density on the first portion and the second portion, and varying the second number of coils for the current density on the third portion, wherein the threshold current density is in a range of 0.1 milliamps per square meter (mA/m2) to 1.25 mA/m2.

16. The method of claim 14, wherein, based on a result of the comparing:

determining that the current density does not satisfy the threshold current density; and modifying the specified current passed to the underground hydrocarbon pipeline to satisfy the threshold current density, wherein the first number of coils along a unit length of the first portion and the second portion is different than the second number of coils along the unit length of the third portion, and wherein the light generator, the polarimeter, and the signal processor are housed together in a single housing.

17. The method of claim 11, wherein the underground hydrocarbon pipeline is a horizontal drill string in a horizontal wellbore drilling system, and wherein determining the quantity of current comprises determining the quantity of current and providing the determined quantity value to a test station in real time.

18. A method comprising:

coiling a fiber optic cable around an underground hydrocarbon pipeline connected to a cathodic protection system configured to pass a specified quantity of current to the underground hydrocarbon pipeline to control external corrosion of the underground hydrocarbon pipeline, wherein a quantity of current flowing through the underground hydrocarbon pipeline is affected by the external corrosion of the underground hydrocarbon pipeline, wherein the underground hydrocarbon pipeline comprises a first portion and a second portion positioned in aerated soil, and a third portion positioned in non-aerated soil and between the first portion and the second portion, wherein a first number of coils of the fiber optic cable around the first portion and the second portion is different from a second number of coils of the fiber optic cable around the third portion, wherein the first number of coils is based on a resistivity of soil in which the first portion and the second portion are buried, and the second number of coils is based on a resistivity of soil in which the third portion is buried;

passing light through the fiber optic cable;

monitoring reflected light passing through a fiber optic cable in response to the light, wherein the reflected light is modulated by the quantity of current flowing through the underground hydrocarbon pipeline;

determining in real time, based on the monitored reflected light, the quantity of current flowing through the underground hydrocarbon pipeline;

determining a current density of the current; and comparing the current density with a threshold current density.

19. The method of claim 18, comprising determining the threshold current density correlative with a coating on the underground hydrocarbon pipeline.

20. The method of claim 19, wherein the threshold current density is in a range of 0.1 milliamps per square meter (mA/m2) to 1.25 mA/m2.

* * * * *